United States Patent [19]

Hsu

[11] Patent Number: 4,841,347
[45] Date of Patent: Jun. 20, 1989

[54] MOS VLSI DEVICE HAVING SHALLOW JUNCTIONS AND METHOD OF MAKING SAME

[75] Inventor: Sheng T. Hsu, West Windsor Township, Mercer County, N.J.

[73] Assignee: General Electric Company, Schenectady, N.Y.

[21] Appl. No.: 792,789

[22] Filed: Oct. 30, 1985

[51] Int. Cl.[4] ............................................. H01L 29/78
[52] U.S. Cl. .................................. 357/23.9; 357/675; 357/20; 357/55; 357/54; 357/71
[58] Field of Search ....................... 357/23, 20, 55, 54, 357/71, 67, 675, 715

[56] References Cited

U.S. PATENT DOCUMENTS 4,384,301 5/1983 Tasch et al. ........................ 357/23
4,458,410 7/1984 Sugaki et al. ...................... 357/715
4,476,475 10/1984 Naem et al. ...................... 357/23.7

Primary Examiner—Edward J. Wojciechowicz
Attorney, Agent, or Firm—Henry I. Steckler; James C. Davis, Jr.; Paul R. Webb, II

[57] ABSTRACT

A semiconductor device and method of making is disclosed wherein the semiconductor device includes a MOSFET with very shallow source and drain regions. The high sheet resistivity normally associated with such shallow regions is obviated by growing an epitaxial layer directly from the surface of the shallow source and drain regions, highly doping the layer, then forming a layer of refractory metal silicide on the epitaxial layer. The resulting structure yields a MOSFET having very shallow source and drain regions with very low sheet resistance.

9 Claims, 2 Drawing Sheets

MOS VLSI DEVICE HAVING SHALLOW JUNCTIONS AND METHOD OF MAKING SAME

The present invention relates to very shallow PN junctions in MOS VLSI devices.

BACKGROUND OF THE INVENTION

Higher packing densities of integrated circuit devices is generally realized by reducing individual component size and correspondingly reducing junction depths and other dimensions of the component elements. When scaling down FETs, the junction depth must be made very shallow in order to prevent the undesirable occurrence of the well known punch-through phenomenon. Because of this scaling down of the dimensions of the various component elements, the resistance and/or sheet resistance of these elements is increased. This creates a serious problem with relatively narrow shallow doped regions such as the source and drain regions of MOS field effect transistors (MOSFETs) in that it is difficult to use these regions for interconnections and the high series resistance of the source and drain will reduce drive current thereby degrading device performance.

One solution to this problem is siliciding of the surfaces of the source and drain regions to reduce their electrical resistance. Such a solution is disclosed in U.S. Pat. No. 4,384,301 which issued May 17, 1983 to Tasch, Jr. et al. Tasch shows a MOSFET wherein the contact surfaces of the source and drain comprise metal silicide. However, such a structure is not without problems too.

The contact resistance between any refractory metal or its silicide and the doped silicon is strongly dependent upon the concentration of doping at the silicide to silicon interface. Typically, in order to obtain a contact having small resistance, the silicon at the interface must have a doping concentration of about $10^{20}$ atoms per $cm^3$. It is virtually impossible to fabricate very shallow source and drain regions having such a high doping level.

SUMMARY OF THE INVENTION

According to the present invention, a MOSFET device and method of making is disclosed. The FET includes a surface, an insulated gate formed on the surface, and source and drain regions formed adjacent the side walls of the gate and extending downwardly from the surface to a depth of less than 100 nm. The method includes the steps:

(a) forming the insulated gate;
(b) forming the source and drain regions adjacent the side walls of the gate so that the regions extend downwardly from the surface to a depth of less than 100 nm;
(c) forming a protective layer over the entire gate;
(d) forming a layer of single crystalline silicon on the surfaces of the source and drain regions;
(e) doping the silicon layer to a depth about equal to its thickness; and
(f) forming a layer of metal silicide on the silicon layer.

DESCRIPTION OF THE PREFERRED EMBODIMENT

In the following description and as shown in FIGS. 1 through 10, specific P and N conductivity type materials and regions are indicated. These indications are by way of example and shall not be deemed to limit the teachings of the present invention. It will be understood that devices having opposite P and N arrangements are considered equivalent in all pertinent respects to the devices described herein.

Figure 1:
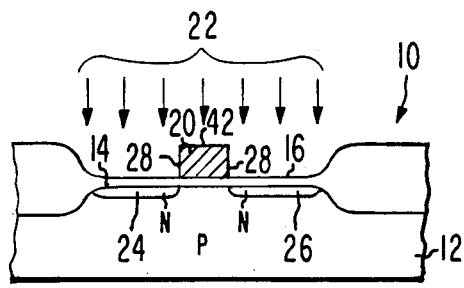
FIGS. 1 through 5 are schematic representations of cross-sectional views of a portion of a semiconductor device in various stages of completion showing one embodiment of the teachings of the present invention.
Figure 2:
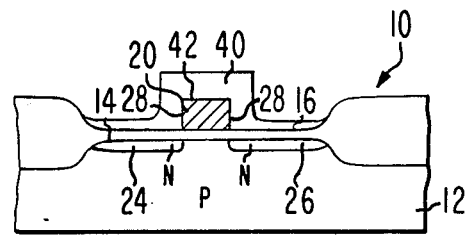

There is shown in FIGS. 1 through 5 a portion of a semiconductor device 10 including a body 12 of a first conductivity type material, such as silicon which is lightly doped P type in the present example, having a planar surface 14. A relatively thin layer 16 of insulating material, such as silicon oxide, is disposed on the planar surface 14 as shown in FIG. 1. An insulated gate 20, of polycrystalline silicon, which is highly doped N type in the present example, and having a length of about 1 $\mu$m, is formed on the layer 16 in a manner that is well known in the art.

Figure 3:
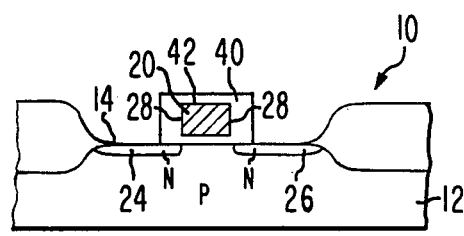

The device 10 is then subjected to a relatively low energy arsenic implantation, approximately 10 kev at a concentration of about $10^{12}$ ions per $cm^3$ as indicated at 22 in FIG. 1. This low energy implant will result in the formation of very shallow source and drain regions 24 and 26 adjacent the side walls 28 of the gate 20. The depth that the regions 24 and 26 extend into the body 12 from the surface 14 should be less than about 100 nm. A protective layer 40 of oxide is then grown in a steam ambient atmosphere at a temperature of about 800° C. to 900° C. Since this oxidation process will grow a relatively thick layer of oxide on a highly doped silicon surface and a thinner layer of oxide on a lightly doped silicon surface, the layer 40 will be substantially thicker than the layer 16. The layer 40 should grow to a thickness of about 200 nm to about 500 nm, while the oxide layer 16 disposed on the surface 14 over the source and drain regions 24 and 26 will be no thicker than about 40 nm to about 100 nm, see FIG. 2. The device 10 is then subjected to a plasma anisotropic etch until all of the oxide of the layer 16 is removed from the surface 14 directly over the source and drain regions 24 and 26. The oxide on the side walls 28 and top 42 of the gate 20 will remain intact thereby completely covering the gate, although the thickness of the oxide on the top will be reduced somewhat as shown in FIG. 3.

Figure 4:
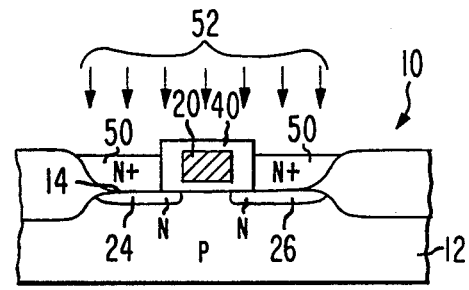
Figure 5:
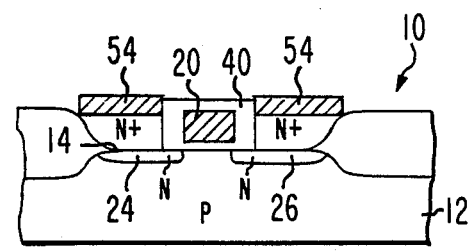
Figure 6:
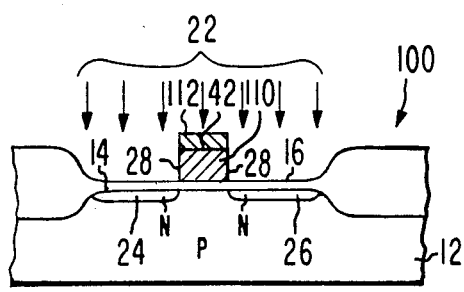
FIGS. 6 through 10 are views similar to those of FIGS. 1 through 5 showing another embodiment of the present invention.
Figure 7:
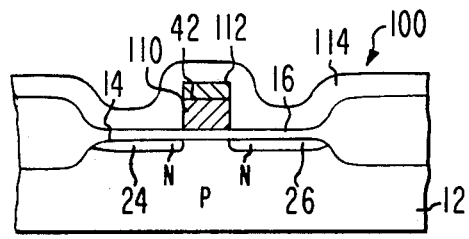

A pair of epitaxial layers 50 of single crystalline silicon is selectively grown from the surface 14 of bare silicon directly over the source and drain regions 24 and 26 in the usual manner, see FIG. 4. The layers 50 should be grown to a thickness no greater than the thickness of the gate electrode 20 so that the layers 50 do not extend over the gate 20 and short the source and drain regions 24 and 26 together. The layer 50 is then subjected to a relatively high energy arsenic implantation indicated as 52 in FIG. 4, to highly dope the layer 50 down to a depth approximately equal to its thickness or slightly less. During the formation of the epitaxial layer 50, some of the impurities of the source and drain regions 24 and 26 will diffuse upwardly into the epitaxial layer 50 a short distance. Therefore, the ion implant need only reach a depth well into this upwardly diffused region. Care should be taken so that the ion implantation does not extend to a depth greater than the depth of the source and drain regions 24 and 26. A layer 54 of refractory metal silicide is then formed on the highly doped epitaxial layer by depositing a layer of refractory metal, such as titanium or tungsten, and then heating the device 10 sufficiently until the refractory metal combines with the silicon at the surface 14 and thereby forming metal silicide. This layer 54 forms the desired low resistance contact to the very shallow source and drain regions 24 and 26.

Another embodiment of the present invention is illustrated in FIGS. 6 through 10. There, a portion of a semiconductor device 100 is shown having structural features similar to features of the device 10 showing similar identifying numbers. Such similar features will not be described again. The significant difference between the two devices 10 and 100 is that the device 100 has a gate 110 that is composed of a suitable metal or metal silicide. Since a protective layer 40 of oxide cannot be grown on a metal gate and a metal silicide gate will oxidize at a rate similar to that of lightly doped silicon, other means must be used to isolate the gate electrode during growth of the epitaxial layer 50. To this end, a layer 112 of silicon nitride is formed on the top surface 42 of the gate 110 in any suitable manner. A layer 114 of conformal oxide having a thickness of about 200 nm to about 500 nm is then formed on the device 100 in the usual manner, for example, by CVD processes, see FIG. 7.

Figure 8:
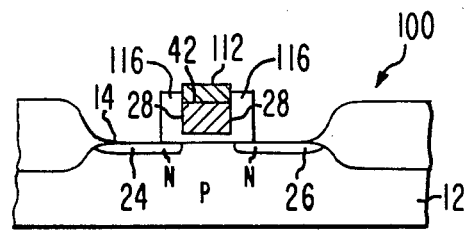
Figure 9:
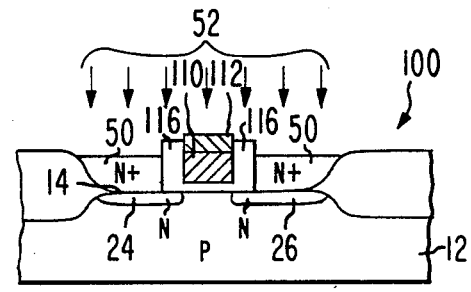
Figure 10:
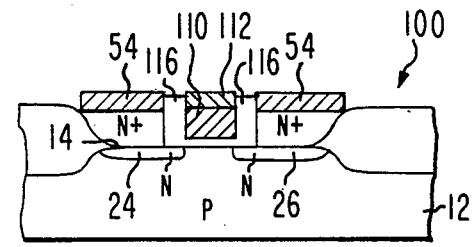

The device 100 is then subjected to a plasma anisotropic etch until all of the oxide of the layers 16 and 114 is removed from the surface 14 directly over the source and drain regions 24 and 26 as shown in FIG. 8. An oxide layer 116 will remain on the side walls 28 of the gate 110 and will extend upwardly to within a short distance of the top of the layer 112 of silicon nitride, as shown in FIGS. 8, 9, and 10. As with the device 10, the epitaxial layer 50 is grown on the source and drain regions 24 and 26 of the device 100, the layer 50 is then subjected to the ion implant 52, and then the layer 54 of refractory metal silicide is formed thereon as shown in FIGS. 9 and 10. The layer 112 of silicon nitride may be optionally removed in the usual manner.

The important advantage of the present invention is that a very low sheet resistance is obtained for shallow source and drain regions having a depth of only 100 nm or less. Additionally, the process does not induce lateral diffusion of impurities into the channel region of the MOSFET thereby helping to assure manufacturing control of the final channel length. Since the protective layer of oxide on the side walls of the gate may be made relatively thick, the gate side wall capacitance can be controlled to be no larger than that of prior art MOSFETs. Another advantage is that the surface topography of the device is quite flat due to the partial burying of the gate electrode that is inherent in the disclosed process.

I claim:

1. An MOS field effect transistor (FET) comprising a body with a surface, an insulated gate on said surface, source and drain regions in said body adjacent said gate extending downwardly from said surface to a predetermined depth and spaced to define a channel region therebetween, two spaced apart layers of doped single cryatalline silicon, one of which is on said surface of said source region in ohmic contact therewith and spaced from said gate and the other of which is on said surface of said drain region in ohmic contact therewith and spaced from said gate, and a layer of refractory metal silicide on said layer of single crystalline silicon, said two layers of doped single crystalline silicon being more highly doped than both of said source and drain regions.

2. The device set forth in claim 1 wherein said depth of said source and drain regions is less than about 100 nm.

3. The device set forth in claim 2 wherein said layer of single crystalline silicon is an epitaxial layer.

4. The device set forth in claim 3 wherein said epitaxial layer has a thickness of about 150 nm to about 300 nm.

5. The device set forth in claim 4 wherein said depth of said source and drain regions is less than about 50 nm.

6. The device set forth in claim 5 wherein said epitaxial layer has a thickness of about 200 nm.

7. The device set forth in claim 6 wherein a layer of silicon oxide is interposed said gate and said surface of said body.

8. The device set forth in claim 7 wherein a layer of silicon oxide is interposed said gate and said layer of doped single crystalline silicon.

9. The device set forth in claim 8 including a layer of silicon nitride disposed on a top surface of said gate.

* * * * *